US011302777B2

(12) United States Patent
Kim et al.

(10) Patent No.: US 11,302,777 B2
(45) Date of Patent: *Apr. 12, 2022

(54) INTEGRATION METHODS TO FABRICATE INTERNAL SPACERS FOR NANOWIRE DEVICES

(71) Applicant: Sony Group Corporation, Tokyo (JP)

(72) Inventors: Seiyon Kim, Portland, OR (US); Kelin J. Kuhn, Aloha, OR (US); Tahir Ghani, Portland, OR (US); Anand S. Murthy, Portland, OR (US); Mark Armstrong, Portland, OR (US); Rafael Rios, Portland, OR (US); Abhijit Jayant Pethe, Hillsboro, OR (US); Willy Rachmady, Beaverton, OR (US)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/013,449

(22) Filed: Sep. 4, 2020

(65) Prior Publication Data

US 2021/0050418 A1    Feb. 18, 2021

Related U.S. Application Data

(60) Continuation of application No. 16/740,132, filed on Jan. 10, 2020, now Pat. No. 10,804,357, which is a
(Continued)

(51) Int. Cl.
*H01L 29/06* (2006.01)
*H01L 29/786* (2006.01)
(Continued)

(52) U.S. Cl.
CPC .... *H01L 29/0673* (2013.01); *H01L 21/30604* (2013.01); *H01L 21/3105* (2013.01);
(Continued)

(58) Field of Classification Search
CPC combination set(s) only.
See application file for complete search history.

(56) References Cited

U.S. PATENT DOCUMENTS 8,460,978 B2    6/2013 Coronel et al.
2005/0023619 A1    2/2005 Orlowski et al.
(Continued)

FOREIGN PATENT DOCUMENTS

WO    WO 2007/017613 A1    2/2007
WO    2012074872 A1    6/2012

OTHER PUBLICATIONS

Taiwanese Office Action dated Feb. 23, 2021 for corresponding Taiwanese Application No. 11020169980.
(Continued)

*Primary Examiner* — Mounir S Amer
(74) *Attorney, Agent, or Firm* — Michael Best & Friedrich LLP

(57) ABSTRACT

A nanowire device having a plurality of internal spacers and a method for forming said internal spacers are disclosed. In an embodiment, a semiconductor device comprises a nanowire stack disposed above a substrate, the nanowire stack having a plurality of vertically-stacked nanowires, a gate structure wrapped around each of the plurality of nanowires, defining a channel region of the device, the gate structure having gate sidewalls, a pair of source/drain regions on opposite sides of the channel region; and an internal spacer on a portion of the gate sidewall between two adjacent nanowires, internal to the nanowire stack. In an embodiment, the internal spacers are formed by depositing spacer material in dimples etched adjacent to the channel region. In an embodiment, the dimples are etched through the channel region. In another embodiment, the dimples are etched through the source/drain region.

9 Claims, 8 Drawing Sheets

Related U.S. Application Data continuation of application No. 16/358,613, filed on Mar. 19, 2019, now Pat. No. 10,580,860, which is a continuation of application No. 16/153,456, filed on Oct. 5, 2018, now Pat. No. 10,283,589, which is a continuation of application No. 15/859,226, filed on Dec. 29, 2017, now Pat. No. 10,121,856, which is a continuation of application No. 15/333,123, filed on Oct. 24, 2016, now Pat. No. 9,859,368, which is a division of application No. 13/539,195, filed on Jun. 29, 2012, now Pat. No. 9,484,447.

(51) Int. Cl.
| | | |
|---|---|---|
| H01L 29/423 | (2006.01) | |
| H01L 29/78 | (2006.01) | |
| H01L 21/306 | (2006.01) | |
| H01L 21/3105 | (2006.01) | |
| H01L 21/3115 | (2006.01) | |
| H01L 29/08 | (2006.01) | |
| H01L 29/66 | (2006.01) | |
| B82Y 40/00 | (2011.01) | |

(52) U.S. Cl.
CPC .... *H01L 21/31155* (2013.01); *H01L 29/0847* (2013.01); *H01L 29/42392* (2013.01); *H01L 29/66545* (2013.01); *H01L 29/66553* (2013.01); *H01L 29/78* (2013.01); *H01L 29/78696* (2013.01); *B82Y 40/00* (2013.01)

(56) References Cited

U.S. PATENT DOCUMENTS

| | | |
|---|---|---|
| 2006/0216897 A1 | 9/2006 | Lee et al. |
| 2007/0126035 A1 | 6/2007 | Ernst et al. |
| 2008/0014689 A1 | 1/2008 | Cleavelin et al. |
| 2009/0127584 A1 | 5/2009 | Morand et al. |
| 2010/0059807 A1 | 3/2010 | Cho et al. |
| 2010/0226195 A1 | 9/2010 | Lue |
| 2010/0264496 A1 | 10/2010 | Thomas et al. |
| 2010/0295024 A1 | 11/2010 | Pemel et al. |
| 2011/0062417 A1* | 3/2011 | Iwayama ............ H01L 29/0673 257/24 |
| 2011/0070734 A1 | 3/2011 | Saracco et al. |
| 2012/0013888 A1 | 6/2012 | Chang et al. |
| 2012/0280354 A1 | 11/2012 | Moroz et al. |
| 2014/0091360 A1 | 4/2014 | Pillarisetty et al. |
| 2017/0194510 A1 | 7/2017 | Doris et al. |

OTHER PUBLICATIONS

International Search Report and Written Opinion dated Nov. 19, 2013 for PCT/US2013/044583 filed Jun. 6, 2013.

T. Ernst et al., "Novel Si-Based Nanowire Devices: Will they serve ultimate MOSFET s scaling or ultimate hybrid integration?" In: Electron Devices Meeting, 2008, IEDM 2008, IEEE International, Dec. 15-17, 2008, pp. 1-4.

Jang-Gn Yun et al., "Single-Crystalline Si Stacked Array (STAR) NANO Flash Memory" In: IEEE Transactions on Electron Devices, vol. 58, No. 4, Apr. 2011, pp. 1006-1014.

Official Letter and Search Report from the Taiwan Intellectual Property Office dated Jan. 18, 2016 for Taiwan Patent Appllication No. 10212342 and English Translation of Search Report.

Notice of Allowance (2 pages) dated Oct. 7, 2016 from the Taiwan Intellectual Property Office for Taiwan Patent Application No. 102121342 and English Translation (1 page) thereof.

Office Action for Taiwan Patent Application No. 105136497, dated Jun. 8, 2017, 6 pages.

International Preliminary Report on Patentability for PCT/US2013/044583 dated Jan. 8, 2015, 7 pages.

Notice of Allowance for Taiwan Patent Application No. 105136497, dated Mar. 12, 2018, 3 pages.

Office Action for Taiwan Patent Application No. 107112609, dated Dec. 20, 2019, 3 pages.

* cited by examiner

INTEGRATION METHODS TO FABRICATE INTERNAL SPACERS FOR NANOWIRE DEVICES

CROSS REFERENCE TO RELATED APPLICATIONS

This is a Continuation of Application Continuation Ser. No. 16/740,132, filed Jan. 10, 2020, which is a Continuation Application of application Ser. No. 16/358,613, filed Mar. 19, 2019 now U.S. Pat. No. 10,580,860 issued Mar. 3, 2020, which is a Continuation Application of application Ser. No. 16/153,456, filed Oct. 5, 2018, now U.S. patent. Ser. No. 10/283,589 issued May 7, 2019, which is a Continuation of application Ser. No. 15/859,226 filed Dec. 29, 2017, now U.S. Pat. No. 10,121,856 issued on Nov. 6, 2018, which is a Continuation of application Ser. No. 15/333,123 filed Oct. 24, 2016, now U.S. Pat. No. 9,859,368 issued Jan. 2, 2018, which is a Divisional of application Ser. No. 13/539,195 filed Jun. 29, 2012, now U.S. Pat. No. 9,484,447 issued Nov. 1, 2016, the entire contents of which are hereby incorporated by reference herein.

BACKGROUND

As integrated device manufacturers continue to shrink the feature sizes of transistor devices to achieve greater circuit density and higher performance, there is a need to manage transistor drive currents while reducing short-channel effects, parasitic capacitance and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL). Wrap-around gate structures and source/drain contacts used in nanowire devices also enable greater management of leakage and capacitance in the active regions, even as drive currents increase.

DETAILED DESCRIPTION

Figure 1A:
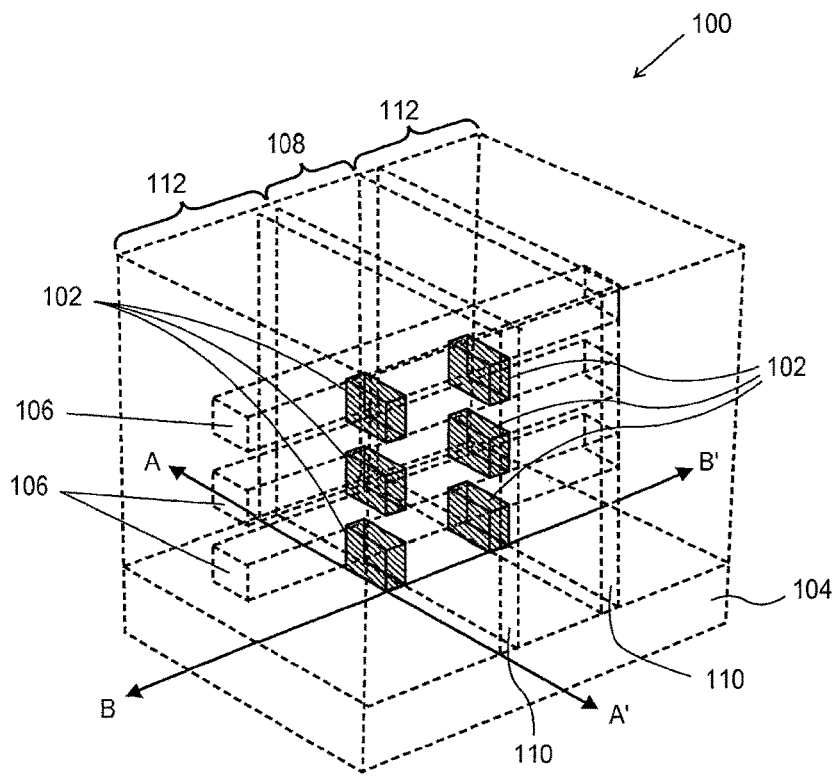
FIG. 1A illustrates an isometric view of a nanowire device having a plurality of internal spacers according to an embodiment of the invention.

Internal spacers for gate all-around transistors and methods for forming such internal spacers are described. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiment.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In one aspect, embodiments of the invention describe a nanowire transistor having internal spacers formed at the portions of the interface of the source/drain region and the channel region that are internal to the nanowire stack. The nanowire device has a wrap-around gate, which defines a channel region of the device. Source/drain regions are disposed on opposite sides of the channel region. A pair of external gate sidewall spacers are formed on the portion of the gate sidewalls that are external to the nanowire stack.

The internal spacers are formed within the source/drain region of the transistor, between adjacent nanowires and adjacent to the channel region/gate structure. The internal spacers are formed of an insulative, low-k dielectric material. The internal spacers provide additional insulation between the gate structure and source/drain contacts, which reduces overlap capacitance, risk of shorting, and current leakage. The internal sidewall spacers may be formed of the same or different material as the external sidewall spacers. Additionally, the internal sidewall spacers may be of the same or different thickness as the external sidewall spacers.

In another aspect, embodiments of the invention describe a method for forming internal spacers by depositing spacer material in dimples formed adjacent to the channel region, where the dimples are formed by etching from the source/drain side of the source/drain-channel interface. For example, a preliminary structure having a nanowire stack disposed on a substrate and a gate structure defining a channel region within the nanowire stack is provided. A pair of source/drain regions of the device are disposed on opposite sides of the channel region. The gate structure has a pair of gate sidewalls, and may be functional or sacrificial. In an embodiment, external gate sidewall spacers are formed on the portion of the gate structure sidewalls that are external to the nanowire stack.

Within the source/drain regions, the nanowire stack consists of alternating layers of nanowire material and sacrificial material. The sacrificial material between the nanowires is removed from the source/drain region to expose the edge the channel region. A dimple is created adjacent to the channel region, defined by the two sidewalls of the adjacent nanowires, the two adjacent exposed surfaces of the external sidewall spacers, and the edge of the channel region. The dimple is open to the source/drain region. In an embodiment, the material below the bottommost nanowire in the nanowire stack may optionally be removed to expose the full perimeter of the bottommost nanowire, in which case the dimple volume is defined by the bottommost nanowire, the edge of the channel region, and the substrate/isolation material, while being open to the source/drain region.

Next, spacer material is conformally deposited over the exposed surfaces within the source/drain region, such that it fills the dimple volumes. Spacer material may also fill the spaces between adjacent nanowires. Optionally, the spacer material that forms on surfaces outside the dimple volume may then be transformed to alter the etch selectivity to allow better control of the etch process so that spacer material is not removed from the dimple. Transformation may occur, for example, by plasma treatment, implantation, oxidation or a combination thereof. In an embodiment, the transformation process is self-aligned to omit the spacer material within the dimple volumes, due to the shielding effect of the external sidewall spacers. The spacer material is then removed from the portion of the source/drain region external to the dimple regions; the dimple regions retain spacer material, forming internal spacers. Additional processing steps may then be performed to form a functioning device, such as forming source/drain contacts or forming a functional gate structure. In a completed device, the internal spacers isolate the gate structure from the source/drain region, together with the external sidewall spacers, to reduce overlap capacitance.

In another aspect, embodiments of the invention describe a method for forming internal spacers by depositing spacer material in dimples etched adjacent to the channel region, where the dimples are formed by etching from the channel side of the source/drain-channel interface. For example, a preliminary structure having a nanowire stack of nanowire and sacrificial material, a sacrificial gate structure defining a channel region, external gate sidewall spacers on the sidewalls of the sacrificial gate structure, and a pair of source/drain regions on opposite sides of the channel region is provided.

The sacrificial gate structure material is removed to expose the nanowire stack in the channel region. Next, the sacrificial material is removed from between adjacent nanowires, to expose the full perimeter of each nanowire. The sacrificial material is etched outside the channel region to create dimples in the source/drain region. The dimples are defined by the two opposing surfaces of the external sidewall spacer, two opposing surfaces of adjacent nanowires, and are open to the channel region. In an embodiment, the thickness of the dimple in the direction normal to the adjacent surface of the channel region is equal to the thickness of the external sidewall spacer. The material below the bottommost nanowire in the stack may optionally be removed to expose the full perimeter of the bottommost nanowire, in which case dimples are also defined below the bottommost nanowire, above the substrate or isolation region.

Next, spacer material is conformally deposited on the surfaces exposed by the opened channel region, such that it fills the dimples formed in the source/drain region. Spacer material may also fill the channel region. Optionally, the spacer material within the channel region is transformed to alter the etch selectivity, so that material within the channel region may be easily removed without etching the material within the dimples. Transformation may occur, for example, by plasma treatment, implantation, oxidation, or a combination thereof. In an embodiment, the transformation process is self-aligned to the channel region while omitting the dimple volumes, due to the shielding of the dimple regions by the external gate sidewall spacers. The spacer material is then removed from within the channel region of the device. The dimple regions retain spacer material, forming internal spacers.

A functional gate structure may then be formed within the channel region, wrapping around the portion of each nanowire within the channel region and contacting the internal spacers. In addition, source/drain contacts may be formed in the source/drain region. The internal spacers improve isolation of the gate structure from the source/drain region, reducing overlap capacitance.

Figure 1B:
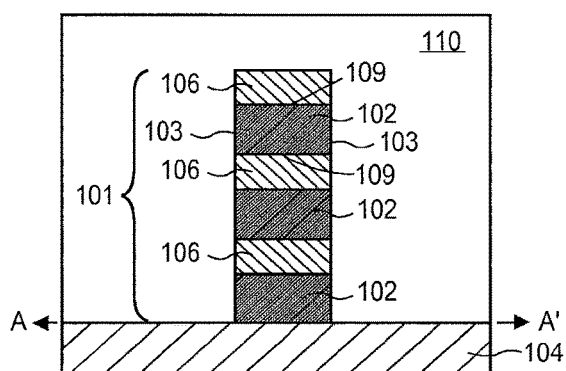
FIG. 1B illustrates a two-dimensional cross-sectional view of a nanowire device having a plurality of internal spacers according to an embodiment of the invention.
Figure 1C:
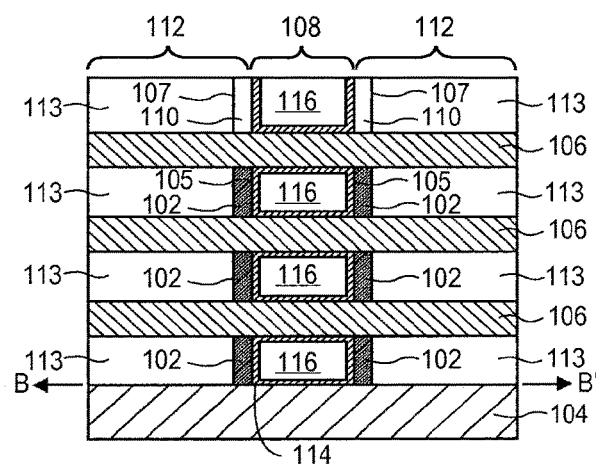
FIG. 1C illustrates a two-dimensional cross-sectional view of a nanowire device having a plurality of internal spacers according to an embodiment of the invention.

FIGS. 1A-1C illustrate a nanowire transistor configured with internal gate sidewall spacers, according to an embodiment of the invention. Components of nanowire transistor 100 that are illustrated in FIGS. 1B and 1C are either omitted or represented by dashed lines in FIG. 1A order to clearly illustrate the placement of internal spacers 102. Referring now to FIG. 1A, an isometric view of a portion of a nanowire transistor 100 having internal gate sidewall spacers 102 is illustrated, according to an embodiment of the invention. In an embodiment, internal spacers 102 are positioned within the source/drain region 112 of device 100, adjacent to the channel region 108, between adjacent nanowires 106, and further defined by external sidewall spacer 110. In an embodiment, another pair of internal spacers 102 are positioned within the source/drain region 112 of device 100, adjacent to the channel region 108, between the bottommost nanowire 106 and substrate 104, and further defined by external sidewall spacer 110.

In an example embodiment, nanowire transistor 100 features a plurality of nanowires 106, disposed above a substrate 104 in a vertical nanowire stack 101, as indicated in the cross-sectional view shown by FIG. 1B. The nanowire stack 101 has an internal region and an external region. In an embodiment, the internal region contains the nanowires 106, the materials and/or volume between the nanowires 106. In an embodiment, the internal region also comprises the materials and/or volume between the bottommost nanowire and the substrate 104. In an embodiment, the external region contains all materials and/or volume not contained within the internal region.

Substrate 104 may be composed of a material suitable for semiconductor device fabrication. In one embodiment, the structure is formed using a bulk semiconductor substrate. Substrate 104 may include, but is not limited to, silicon, germanium, silicon-germanium, or a III-V compound semiconductor material. In another embodiment, the structure is formed using a silicon-on-insulator (SOI) substrate. An SOI substrate includes a lower bulk substrate, a middle insulator layer disposed on the lower bulk substrate, and a top monocrystalline layer. The middle insulator layer may comprise silicon dioxide, silicon nitride, or silicon oxynitride. The top single crystalline layer may be any suitable semiconductor material, such as those listed above for a bulk substrate.

In an embodiment, nanowires 106 are formed from a semiconductor material. In one such embodiment, nanowires 106 are single-crystalline and have a lattice constant. Nanowires 106 may be a material such as, but not limited to, silicon, germanium, SiGe, GaAs, InSb, GaP, GaSb, InAlAs, InGaAs, GaSbP, GaAsSb, and InP. In a specific embodiment, nanowires 106 are silicon. In another specific embodiment, nanowires 106 are germanium. In an embodiment, the nanowires 106 comprise a stressed material, particularly the channel portion of nanowires 106 within channel region 108 of device 100. In an embodiment, nanowires 106 have source/drain portions in source/drain regions 112 of device 100.

Channel region 108 of the device 100 is defined by a gate structure, which wraps around the perimeter of each nanowire 106, according to an embodiment of the invention. An example gate structure is illustrated in FIG. 1C, which is a cross-sectional view of the nanowire device in FIG. 1A, taken along line B-B'. In FIG. 1C, the gate structure comprises a gate dielectric layer 114 in contact with the full perimeter of the channel portions of the nanowires 106, and a gate electrode 116 wrapping around the gate dielectric layer 114, according to an embodiment. In an embodiment, gate dielectric layer 114 is composed of a high-k dielectric material. For example, in one embodiment, the gate dielectric layer 114 is composed of a material such as, but not limited to, hafnium oxide, hafnium oxy-nitiride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In an embodiment, gate dielectric layer 114 is from 10 to 60 .ANG. thick.

In an embodiment, gate electrode 116 is composed of a metal layer such as, but not limited to, metal nitrides, metal carbides, metal silicides, metal aluminides, halfnium, zirconium, titanium, tantalum, aluminum, ruthenium, palladium, cobalt, or nickel. In a specific embodiment, the gate electrode is composed of a non-workfunction-setting fill material formed above a metal workfunction-setting layer. In an embodiment, gate electrode 116 comprises a p-type work function metal. In another embodiment, gate electrode 116 comprises an n-type work function metal.

A pair of source/drain regions 112 are disposed on opposite sides of the channel region 108, according to an embodiment. In an embodiment, a pair of external sidewall spacers 110 are formed on the portion of the gate structure sidewalls external to the nanowire stack, one within each of the source/drain regions 112. The thickness and material of the external sidewall spacer 110 may be selected to offset doping of the source/drain portions of nanowires 106, minimize overlap capacitance between the portions of channel region 108 and source/drain region 112 external to the nanowire stack, to reduce device leakage, and to reduce the risk of shorting between the gate electrode and the source/drain contacts. Sidewall spacers 110 may be composed of an insulative dielectric material such as, but not limited to, silicon dioxide, silicon oxy-nitride, or silicon nitride. External sidewall spacers 110 are from 20 to 100 .ANG. thick.

Internal sidewall spacers 102 are adjacent to the gate structure, within the source/drain region 112, between adjacent nanowires 106, according to an embodiment of the invention. FIG. 1B illustrates a cross-sectional view of the nanowire device 100 in FIG. 1A, taken along line A-A'. In an embodiment, internal sidewall spacers 102 are defined by two opposing surfaces 109 of adjacent nanowires 106, and two opposing surfaces 103 of external sidewall spacers 110. Referring to FIG. 1C, internal sidewall spacers 102 are further defined by channel region 108, as defined by the surface of the gate structure, according to an embodiment. In an embodiment, internal sidewall spacers 102 are aligned with surface 107 of external sidewall spacer 110. In an embodiment, internal sidewall spacers 102 are formed from the same dielectric material as the external sidewall spacers 110. Additionally, the internal sidewall spacers may be of the same or different thickness as the external sidewall spacers 110, such as from 20 to 100 .ANG.

In an embodiment, the internal sidewall spacers 102 protect against shorting and leakage, and reduce overlap capacitance between the gate structure and conductive or semiconductive material 113 in the internal region of the nanowire stack within the source/drain regions 112 of device 100. For example, where material 113 is a metal source/drain contact, wrapping around the source/drain portions of nanowires 106, internal spacers reduce capacitance between the portions of the gate electrode 116 and the metal source/drain contacts 113 that are internal to the nanowire stack. Material 113 may also be a semiconductive material. The internal sidewall spacers 102 may be formed of a suitable dielectric material.

Figure 1D:
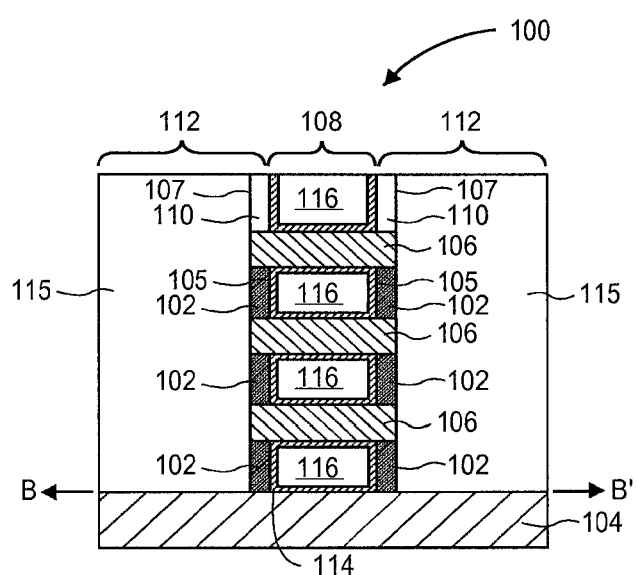
FIG. 1D illustrates a two-dimensional cross-sectional view of a nanowire device having a plurality of internal spacers according to an embodiment of the invention.

In another embodiment, source/drain regions 112 comprise homogeneous source and drain portions 115. In a specific embodiment, homogeneous source/drain portions 115 are in electrical contact with the channel portions of each nanowire 106. In an embodiment, homogeneous source and drain portions 115 may be doped or undoped semiconductor material. In another specific embodiment, homogeneous source/drain portions 115 are a metal species. In an embodiment, a portion of nanowires 106 remains in the source/drain region 112, such as between internal spacers 102, as shown in FIG. 1D. In another embodiment, all of the source/drain portions of nanowires 106 have been removed, such that nanowires 106 are only within the channel region 108.

In yet other example embodiments, the bottommost nanowire 106 in the nanowire stack rests on the top surface of a semiconductor fin extending from the substrate 104, forming a tri-gate device. In such an embodiment, the gate structure does not wrap around the full perimeter of the bottommost nanowire 106. In an embodiment where there is no gate portion below the bottommost nanowire and internal to the nanowire stack, internal spacers are not required below the bottommost nanowire to isolate the gate stack from materials in the source/drain region of the device.

FIGS. 2A-2E are cross-sectional views illustrating a method for forming a nanowire transistor configured with internal spacers by opening the source/drain region of the device, according to an embodiment of the invention. Each figure illustrates two alternate cross-sectional views of the partially-formed nanowire transistor 200: one on the left taken through the source/drain region of the device, and one on the right taken parallel to nanowires 206. The location of the source/drain cross-sectional left-hand view is illustrated by a dotted line in the right hand view.

Figure 2A:
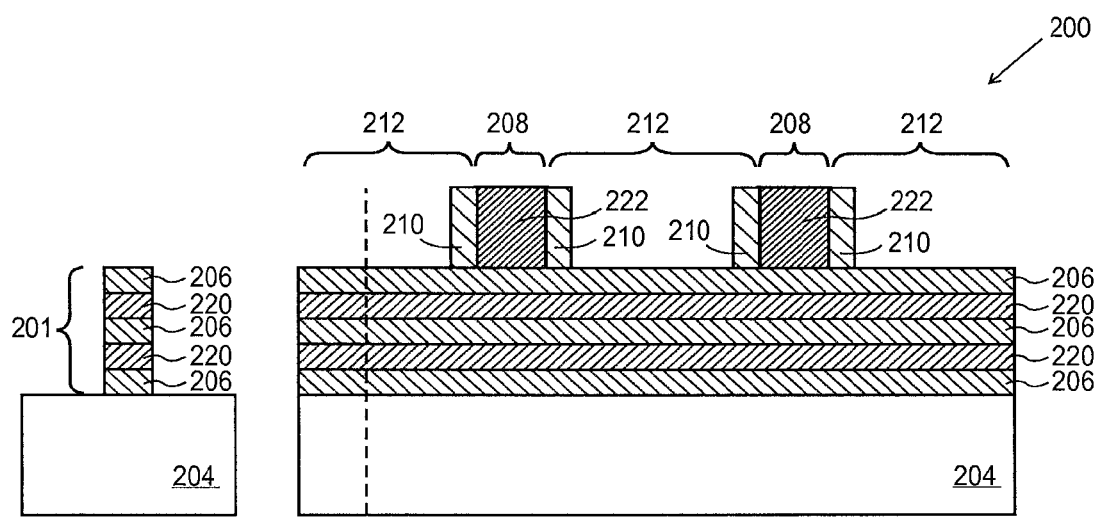
FIGS. 2A-2G illustrate two-dimensional cross-sectional views of a method for forming a nanowire device having internal spacers according to an embodiment of the invention.

Referring to FIG. 2A, a structure 200 having a nanowire stack 201 disposed on a substrate 204 and two gate structures 222, each defining a channel region 208 within the nanowire stack 200 is provided. Source/drain regions 212 of the device 200 are disposed on opposite sides of each channel region 208.

In an embodiment, the nanowire stack 201 comprises nanowires 206 and sacrificial material 220. In an embodiment, the volume within nanowires 206 and sacrificial material 220 is internal to nanowire stack 201, while volume outside nanowires 206 and sacrificial material 220 is external to nanowire stack 201. Nanowire stack 201 may be formed by known methods, such as forming alternating layers of nanowire and sacrificial material over substrate 204, and then etching the layers to form a fin-type structure (nanowire stack 201), e.g. with a mask and plasma etch process.

In an embodiment, sacrificial material 220 may be any material that can be selectively etched with respect to nanowires 206. Nanowires 206 and sacrificial material 220 may each be a material such as, but not limited to, silicon, germanium, SiGe, GaAs, InSb, GaP, GaSb, InAlAs, InGaAs, GaSbP, GaAsSb, and InP. In a specific embodiment, nanowires 206 are silicon and sacrificial material 220 is SiGe. In another specific embodiment, nanowires 206 are germanium, and sacrificial material 220 is SiGe. In an embodiment, sacrificial material 220 is formed to a thickness sufficient to create a desired amount of strain in nanowires 206.

The gate structures 222 may be functional or sacrificial. In the example embodiment illustrated in FIG. 2A, gate structures 222 are sacrificial, wrapping around nanowire stack 201. Gate structure 222 may be any suitable material, such as polysilicon. In another embodiment, the gate structures are functional and each comprises a gate dielectric layer and a gate electrode that wrap around the channel portions of nanowires 206. Functional gate materials are discussed above.

External gate sidewall spacers 210 are formed on the portion of the gate structure 222 sidewalls that are external to the nanowire stack 201, according to an embodiment of the invention. External sidewall spacers 210 may be formed using conventional methods of forming spacers known in the art. External sidewall spacers 210 may be any suitable dielectric material such as, but not limited to, silicon oxide, silicon nitride, silicon oxynitride and combinations thereof. In an embodiment, external sidewall spacers 210 are from 20 to 100 .ANG. thick.

Figure 2B:
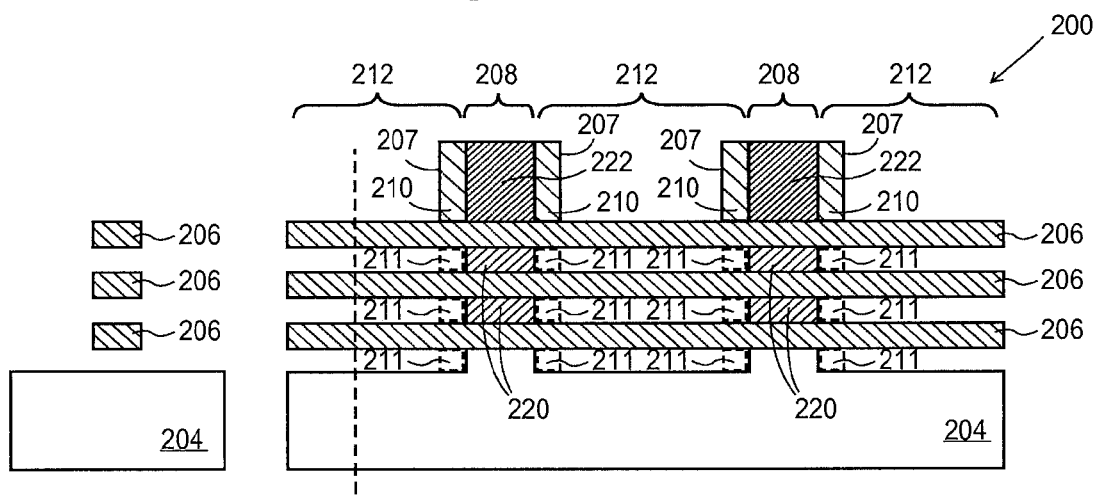

In FIG. 2B, sacrificial material 220 within the source/drain regions 212 of the device 200 is removed from between nanowires 206, according to an embodiment of the invention. In an embodiment, sacrificial material 220 is removed up to the edge of the channel region 208, creating a plurality of dimple volumes 211. In an embodiment, dimples 211 are defined by the surfaces of the two adjacent nanowires 206, the interface of the internal and external regions of the nanowire stack 201, and the edge of the channel region 208. In an embodiment, external sidewall spacer 210 wraps around nanowire stack 201 at the interface of the internal and external regions of the nanowire stack, in contact with dimple volumes 211.

Sacrificial material 220 may be removed using any known etchant that is selective to nanowires 206. In an embodiment, sacrificial material 220 is removed by a timed wet etch process, timed so as to undercut the external sidewall spacers 210. The selectivity of the etchant is greater than 50:1 for sacrificial material over nanowire material. In an embodiment, the selectivity is greater than 100:1. In an embodiment where nanowires 206 are silicon and sacrificial material 220 is silicon germanium, sacrificial material 220 is selectively removed using a wet etchant such as, but not limited to, aqueous carboxylic acid/nitric acid/HF solution and aqueous citric acid/nitric acid/HF solution. In an embodiment where nanowires 206 are germanium and sacrificial material 220 is silicon germanium, sacrificial material 220 is selectively removed using a wet etchant such as, but not limited to, ammonium hydroxide (NH.sub.4OH), tetramethylammonium hydroxide (TMAH), ethylenediamine pyrocatechol (EDP), or potassium hydroxide (KOH) solution. In another embodiment, sacrificial material 220 is removed by a combination of wet and dry etch processes.

In addition, the substrate 204 material below the bottommost nanowire 206 in the nanowire stack 201 may optionally be removed to expose the full perimeter of the bottommost nanowire 206, in which case the dimple volume 211 is defined by the bottommost nanowire 206, the edge of the channel region 208, and the substrate 204. Substrate 204 may be etched by known processes selective to the substrate material over the nanowire material.

Figure 2C:
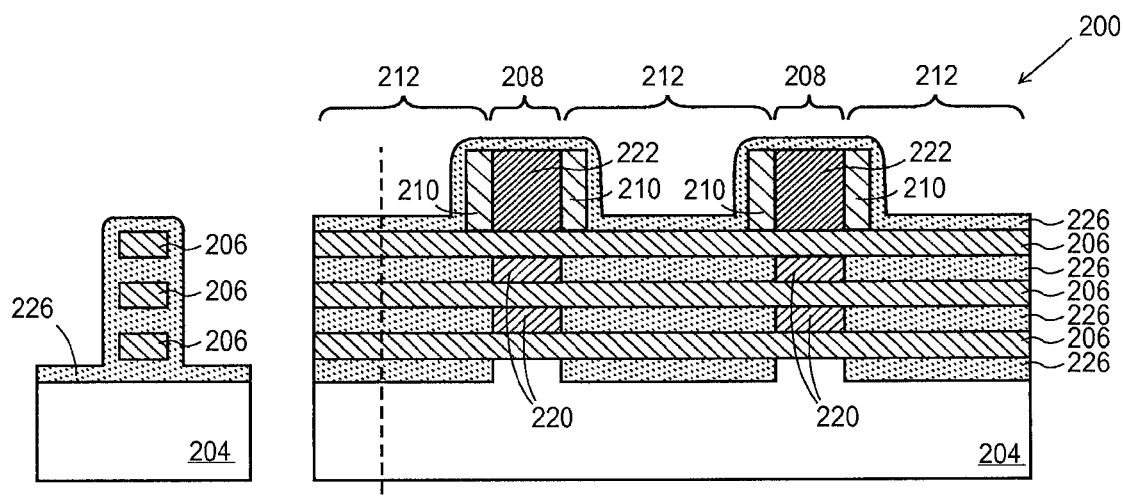

Next, in FIG. 2C, spacer material 226 is deposited over the exposed surfaces within the source/drain region, such that it fills the dimple volumes 211, according to an embodiment of the invention. In an example embodiment, spacer material 226 fills the spaces between adjacent nanowires 206. In an embodiment, spacer material 226 will be used to form internal spacers 202. Spacer material 226 may be any suitable dielectric material, such as silicon dioxide, silicon oxy-nitride, or silicon nitride. In an embodiment, spacer material 226 is a low-k dielectric material, i.e., having a dielectric constant less than 3.6. Spacer material 226 may be deposited by any conformal method, such as atomic layer deposition (ALD) or chemical vapor deposition (CVD).

Figure 2D:
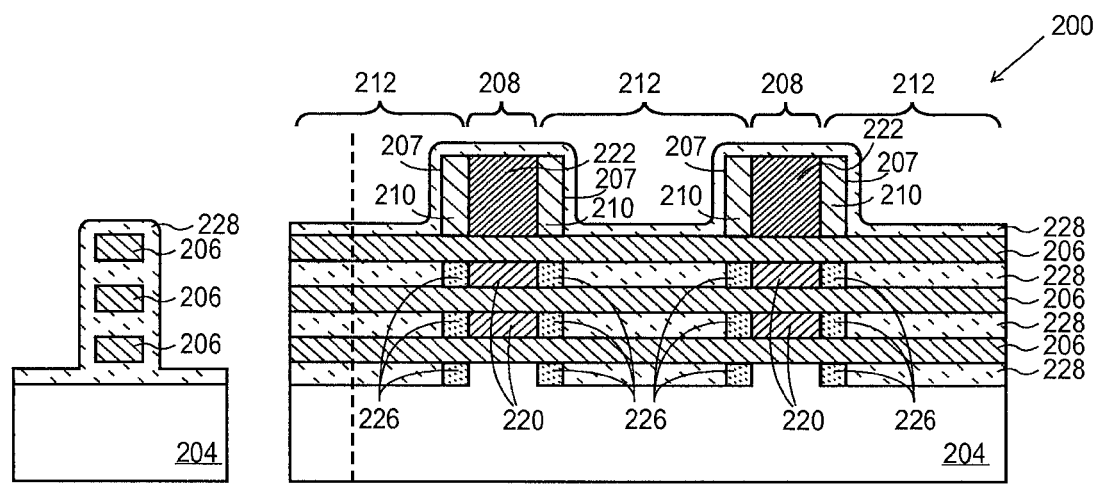

Optionally, the spacer material 226 deposited outside the dimple volume 211 may then be transformed into transformed spacer material 228, as shown in the example embodiment illustrated in FIG. 2D. In an embodiment, transformed spacer material 228 has a different etch selectivity than spacer material 226. By altering the etch selectivity of transformed spacer material 228 as compared to spacer material 226, the etch process to remove excess spacer material from outside the dimple 211 is more easily controlled. Transformation may occur by plasma treatment, implantation, oxidation, or a combination thereof. In an embodiment, external gate sidewall spacers 210 protect the dimple volumes from the transformation process, so the transformation is self-aligned to omit the spacer material 226 within the dimple volumes 211. The transformation process is sufficient to alter the etch selectivity of the spacer material 226 outside of the dimple volumes, but does not affect mobility or degrade performance of the nanowires 206 within the source/drain regions 212.

Figure 2E:
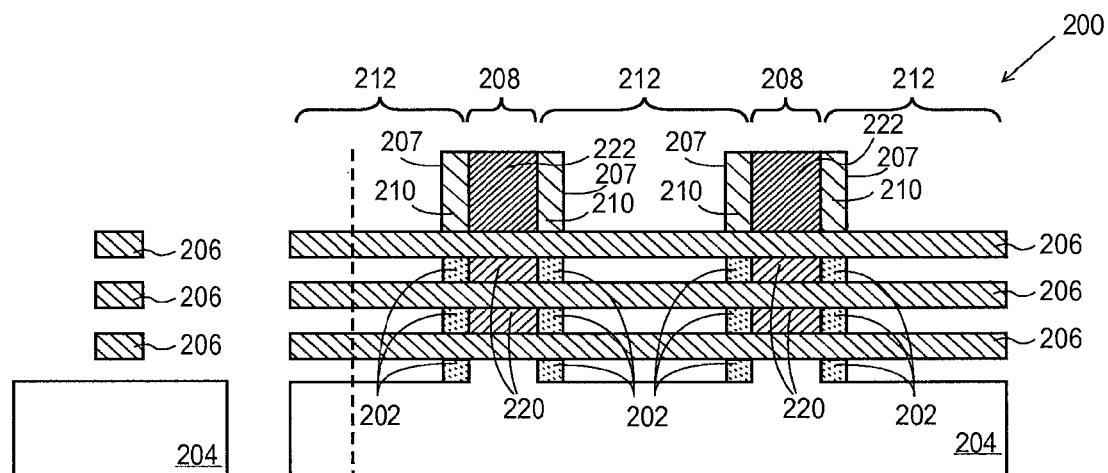

Then, as shown in FIG. 2E, the spacer material is removed from the portion of the source/drain region 212 outside of the dimple volume; the dimple volumes retain spacer material 226, forming internal spacers 202. In an embodiment, where spacer material has been transformed into transformed spacer material 228, transformed spacer material 228 may be removed by a wet-etch process selective to transformed spacer material 228 over spacer material 226. In another embodiment, transformed spacer material 228 may be removed by a timed isotropic wet etch process. In yet another embodiment, a dry etch process is used to remove transformed spacer material 228. A combination of dry and wet etch processes may also be used to remove transformed spacer material 228.

In an embodiment where spacer material 226 outside of dimples 211 have not been transformed, a timed isotropic wet etch process is used to remove a portion of spacer material 226 without removing spacer material 226 from dimple 211. In another embodiment, a dry-etch process is used to remove a portion of spacer material 226 without removing spacer material 226 from dimple 211. In another embodiment, a combination of dry and wet etch processes is used to remove a portion of spacer material 226 without removing spacer material 226 from dimple 211.

Figure 2F:
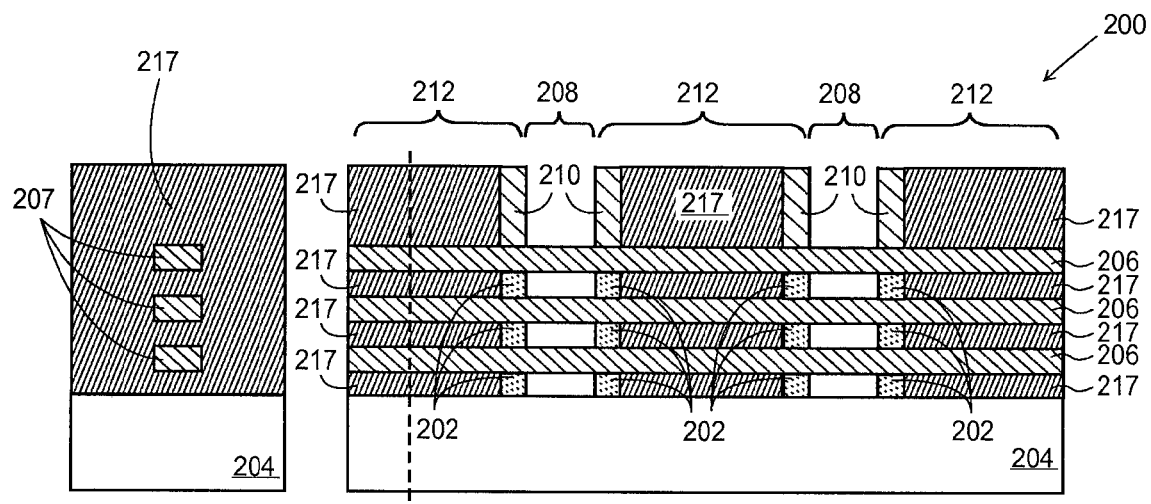

Next, a functional gate electrode is formed, for example, by a replacement metal gate (RMG) process, according to an embodiment of the invention. As shown in FIG. 2F, dielectric material 217 is blanket deposited over the structure, filling the source/drain regions 212, according to an embodiment. Dielectric material 217 may be any suitable dielectric material, such as silicon dioxide, silicon oxy-nitride, or silicon nitride.

The channel region is then opened, according to an embodiment. In an embodiment, the sacrificial gate structure 222 is first removed to expose the channel portion of the nanowire stack within channel region 208. Sacrificial gate electrode 222 may be removed using a conventional etching method such a plasma dry etch or a wet etch. In an embodiment, a wet etchant such as a TMAH solution may be used to selectively remove the sacrificial gate.

Next, the sacrificial material 220 is removed from the channel region 208, to expose the full perimeter of the channel portion of each nanowire 206, according to an embodiment. The removal of sacrificial material 220 leaves a void between adjacent nanowires 206. In an embodiment, sacrificial material 226 is etched to expose the surface of internal spacers 202. Sacrificial material 220 may be etched by any suitable process, as discussed above with respect to the etching of sacrificial material 220 from the source/drain regions 212. In an embodiment, the portion of substrate 204 underlying the bottommost nanowire 206 is removed in order to expose the full perimeter of the bottommost nanowire 206, as discussed above with respect to etching substrate 204 to expose the full perimeter of the source/drain portion of the bottommost nanowire 206.

Figure 2G:
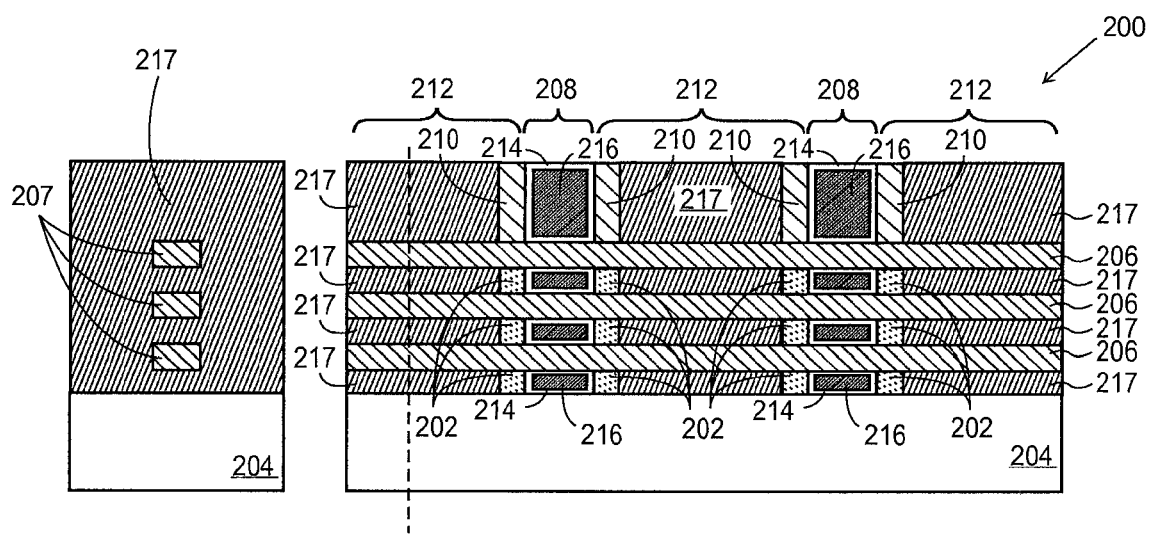

Then, as shown in FIG. 2G, a functional gate structure may be formed within the channel region 208, wrapping around the channel portion of each nanowire 206. The gate structure may comprise a gate dielectric layer 214 and gate electrode 216. In an embodiment, gate dielectric layer 214 is conformally deposited on all exposed surfaces within the channel region 208, including the exposed surface of the internal spacer 202. In an embodiment gate electrode 216 is formed over the gate dielectric layer 214, wrapping around the portion of each nanowire 206 within the channel region 208. Gate dielectric 214 and gate electrode 216 may be formed by any suitable deposition method that is conformal, for example, ALD.

In another embodiment, the RMG process is performed after deposition of spacer material 226, as shown in FIG. 2C. In an alternative embodiment, the RMG process is performed after the transformation of spacer material 226, as shown in FIG. 2D.

Additional processing steps may be performed to form a functioning device, such as forming source/drain contacts. Source/drain contacts may be formed in trenches etched in dielectric 217 to expose source/drain portions of nanowires 206. In an embodiment, source/drain contacts are formed from a metal species that wraps around the source/drain portions of nanowires 206. In another embodiment, homogeneous source/drain portions are formed as discussed above with respect to FIG. 1D. In a completed device, the internal spacers 202 isolate the functional gate structure from the source/drain region. In an embodiment, internal spacers 202 reduce overlap capacitance between the portions of gate electrode 216 internal to the nanowire stack and any adjacent conductive or semiconductive material within the source/drain region 212.

FIGS. 3A-3F are cross-sectional views of a method for forming a nanowire transistor 300 configured with internal spacers by opening the channel region of the device, according to an embodiment of the invention. Each figure illustrates two alternate cross-sectional views of the partially-formed nanowire transistor 300: one on the left taken through the channel region of the device, and one on the right taken parallel to the nanowires. The location of the left-hand channel view is illustrated by a dotted line on the right-hand view parallel to the nanowires.

Figure 3A:
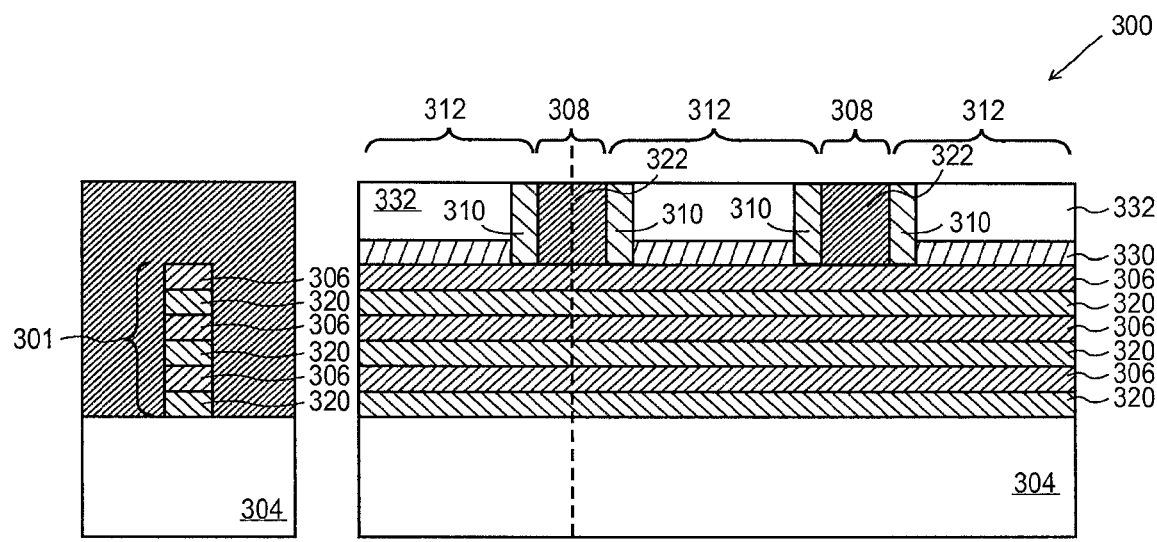
FIGS. 3A-3F illustrate two-dimensional cross-sectional views of a method for forming a nanowire device internal spacers according to an embodiment of the invention.

Referring to FIG. 3A, a structure is provided having a nanowire stack 301 disposed above a substrate 304, a sacrificial gate structure 322 defining a channel region 308, external gate sidewall spacers 310 on the sidewalls of sacrificial gate structure 322, and source/drain regions 312 on opposite sides of the channel region 308. In an embodiment, source/drain regions 312 are covered by hardmask 330 and interlayer dielectric 332. Hardmask 330 may be any material suitable for protecting underlying nanowires from etching and doping processes. Interlayer dielectric 332 may be any known low-k dielectric material, such as silicon dioxide, silicon oxy-nitride, or silicon nitride.

Figure 3B:
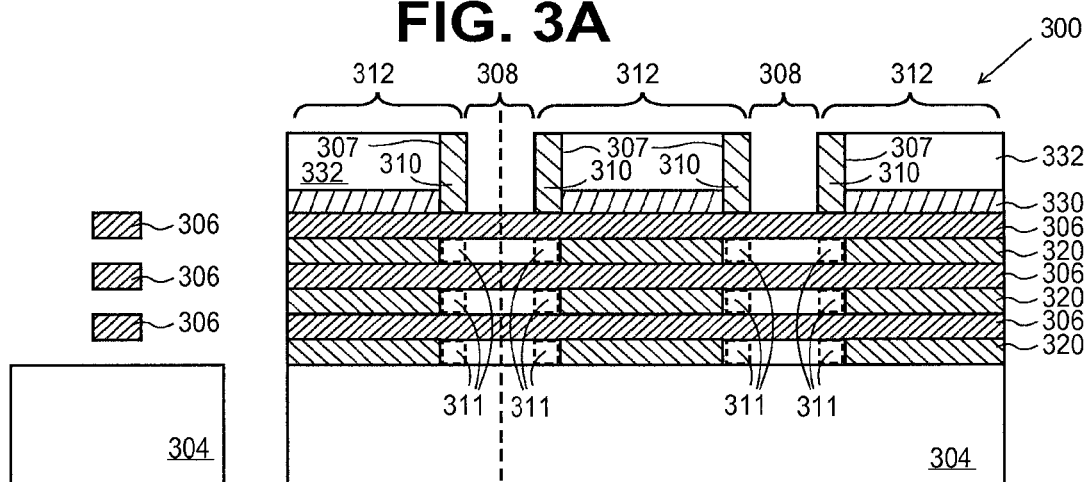

Next, as shown in FIG. 3B, nanowires 306 are exposed within the channel region 308, according to an embodiment of the invention. In an embodiment, the sacrificial gate structure 322 is first removed to expose the portion of the nanowire stack 301 within channel region 308. Sacrificial gate electrode 322 may be removed using a conventional etching method such a plasma dry etch or a wet etch. In an embodiment, a wet etchant such as a TMAH solution may be used to selectively remove the sacrificial gate.

Next, the sacrificial material 320 is removed from the channel region 308, to expose the full perimeter of each nanowire 306, according to an embodiment. The removal of sacrificial material 320 leaves a void between adjacent nanowires 306. In an embodiment, sacrificial material 326 is etched beyond the channel region 308 to partially extend into the source/drain region 312 in order to define dimples 311 in which the internal spacers will be formed. In an embodiment, dimples 311 are etched in alignment with surface 307 of external sidewall spacer 310. In an example embodiment, the dimple volume 311 is defined by the edge of the channel region 308, the interface of the internal and external regions of the nanowire stack, and the surfaces of two adjacent nanowires 306. In an embodiment, external sidewall spacer 310 wraps around nanowire stack 301 at the interface of the internal and external regions of the nanowire stack, in contact with dimple volumes 311. Sacrificial material 320 may be etched by any suitable process, as discussed above with respect to the etching of sacrificial material 220. In an embodiment, the portion of substrate 304 underlying the bottommost nanowire 306 is removed in order to expose the full perimeter of the bottommost nanowire 306, defining a dimple volume 311 below bottommost nanowire 306. Substrate 304 may be etched by any known process that is selective to substrate 304 material over nanowire 306 material.

Figure 3C:
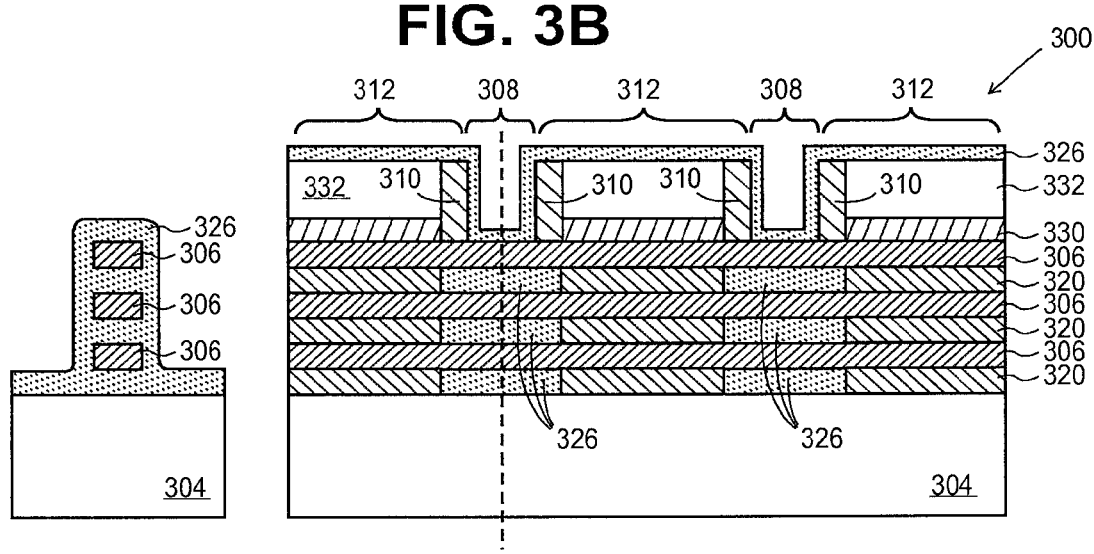

Referring to FIG. 3C, spacer material 326 is then deposited within the opened channel region 308 so that it fills the dimples 311, according to an embodiment of the invention. In an embodiment, spacer material 326 fills the channel region 308. Spacer material 326 may be deposited by any conformal method, such as ALD or CVD.

Figure 3D:
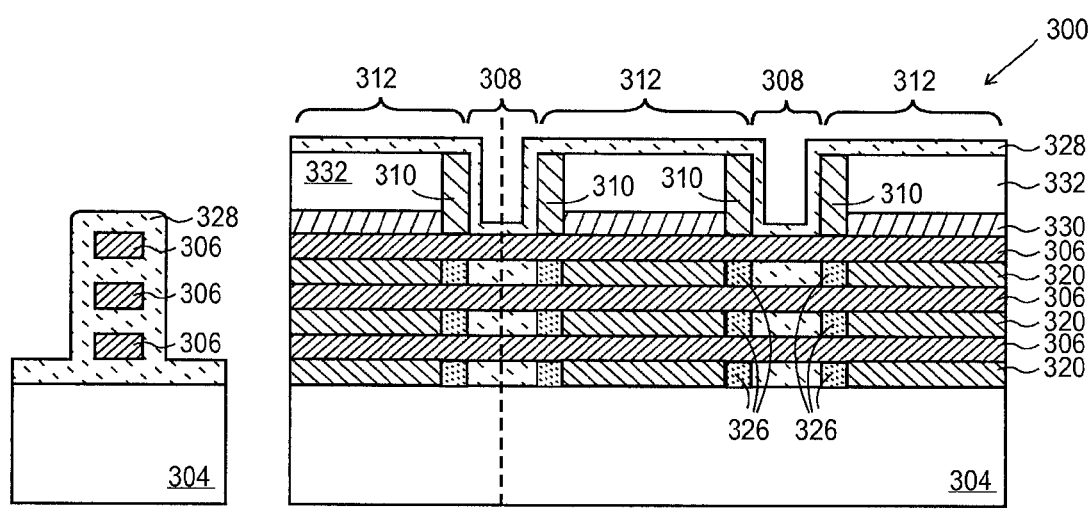

Optionally, as shown in FIG. 3D, the spacer material 326 within the channel region 308, but not within the dimples 311, is transformed to form transformed spacer material 328. In an embodiment, transformed spacer material 328 has a different etch selectivity than spacer material 326. By altering the etch selectivity of transformed spacer material 328 as compared to spacer material 326, the etch process to remove excess spacer material from outside the dimple 311 is more easily controlled. Transformation may occur by plasma treatment, implantation, oxidation, or a combination thereof.

In an example embodiment, transformed spacer material 328 is confined to the channel region 308, due to a self-aligned transformation process, wherein external gate sidewall spacers 310 protect the spacer material 326 within dimples 311 from the transformation process. In an embodiment, the transformation process is sufficient to alter the etch selectivity of the spacer material 326 within the channel region, but does not affect mobility or degrade performance of the nanowires 306.

Figure 3E:
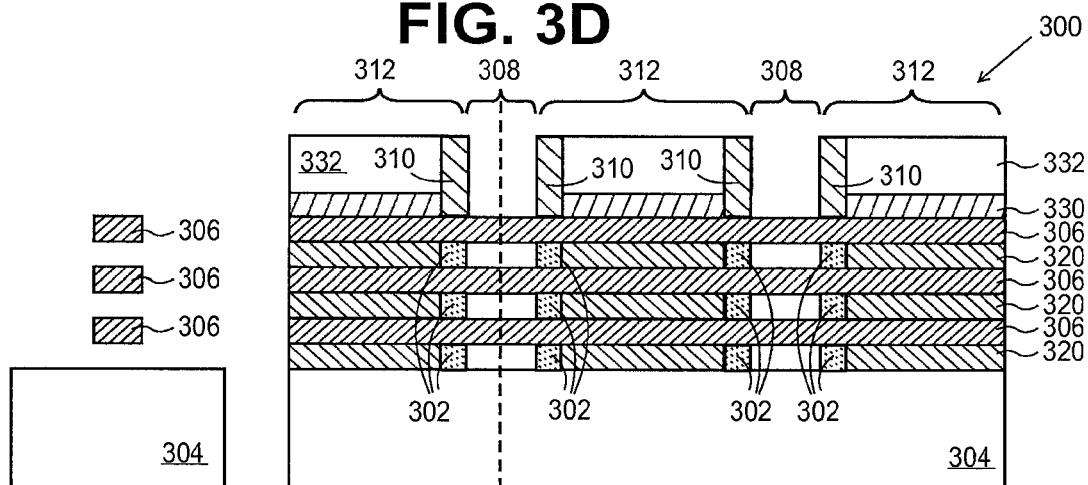

Next, in FIG. 3E, the spacer material is removed from within the channel region of the device. In an embodiment where spacer material 326 in the channel region has been transformed to transformed spacer material 328, transformed spacer material 328 may be removed by a wet-etch process selective to transformed spacer material 328 over spacer material 326. In another embodiment, transformed spacer material 328 is removed by a timed isotropic wet etch process. In another embodiment, transformed spacer material 328 is removed by a dry-etch process. In another embodiment, transformed spacer material 328 is removed by a combination of dry and wet etch processes.

In another embodiment where spacer material 326 has not been transformed, spacer material 326 located within the channel region 308 is removed by a timed isotropic wet etch process timed to not remove spacer material 326 from dimples 311. In another embodiment, spacer material 326 located within the channel region 308 is removed by a dry-etch process. In another embodiment, spacer material 326 is removed by a combination of dry and wet etch processes. In an embodiment, the dimples retain spacer material 326 to form internal spacers 302.

Figure 3F:
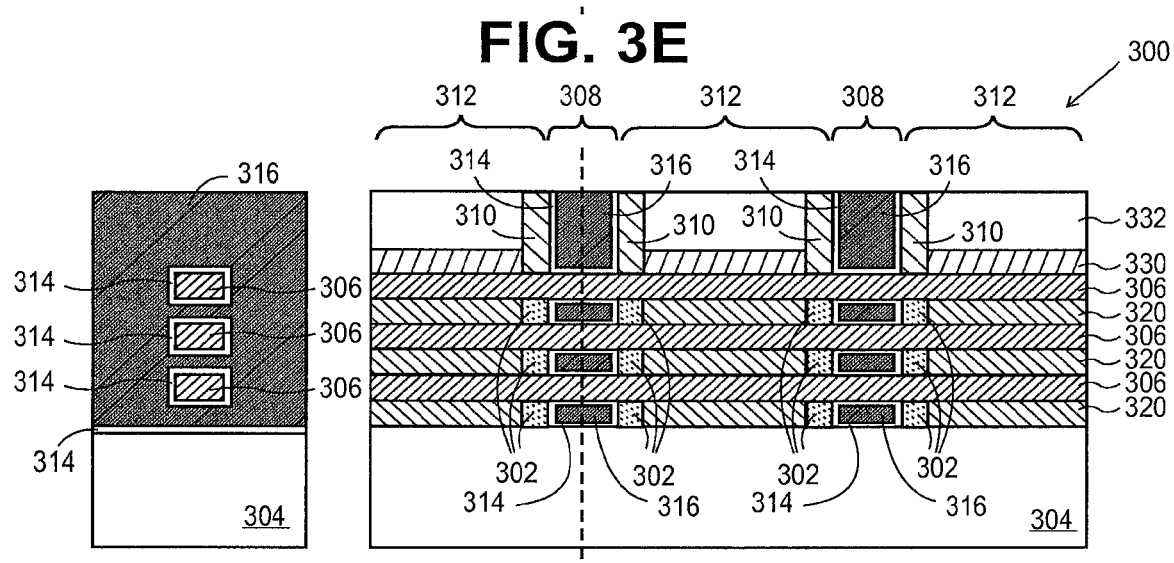

Then, as shown in FIG. 3F, a functional gate structure may be formed within the channel region 308, wrapping around the portion of each nanowire 306. The gate structure may comprise a gate dielectric layer 314 and gate electrode 316. In an embodiment, gate dielectric layer 314 is conformally deposited on all exposed surfaces within the channel region 308, including the exposed surface of the internal spacer 302. In an embodiment gate electrode 316 is formed over the gate dielectric layer 314, wrapping around the portion of each nanowire 306 within the channel region 308. Gate dielectric 314 and gate electrode 316 may be formed by any suitable deposition method that is conformal, for example, ALD.

Additional processing steps may then be performed to form a functioning device, such as forming source/drain contacts. Source/drain contacts may be formed in trenches etched to expose the full perimeter of source/drain portions of nanowires 306. In an embodiment, source/drain contacts are formed from a metal species that wraps around the source/drain portions of nanowires 306. In another embodiment, homogeneous source/drain portions are formed as discussed above with respect to FIG. 1D. In a completed device, the internal spacers 302 isolate the functional gate structure from the source/drain region. In an embodiment, internal spacers 302 reduce overlap capacitance between the portions of gate electrode 316 internal to the nanowire stack and any adjacent conductive or semiconductive material within the source/drain region 312.

Figure 4:
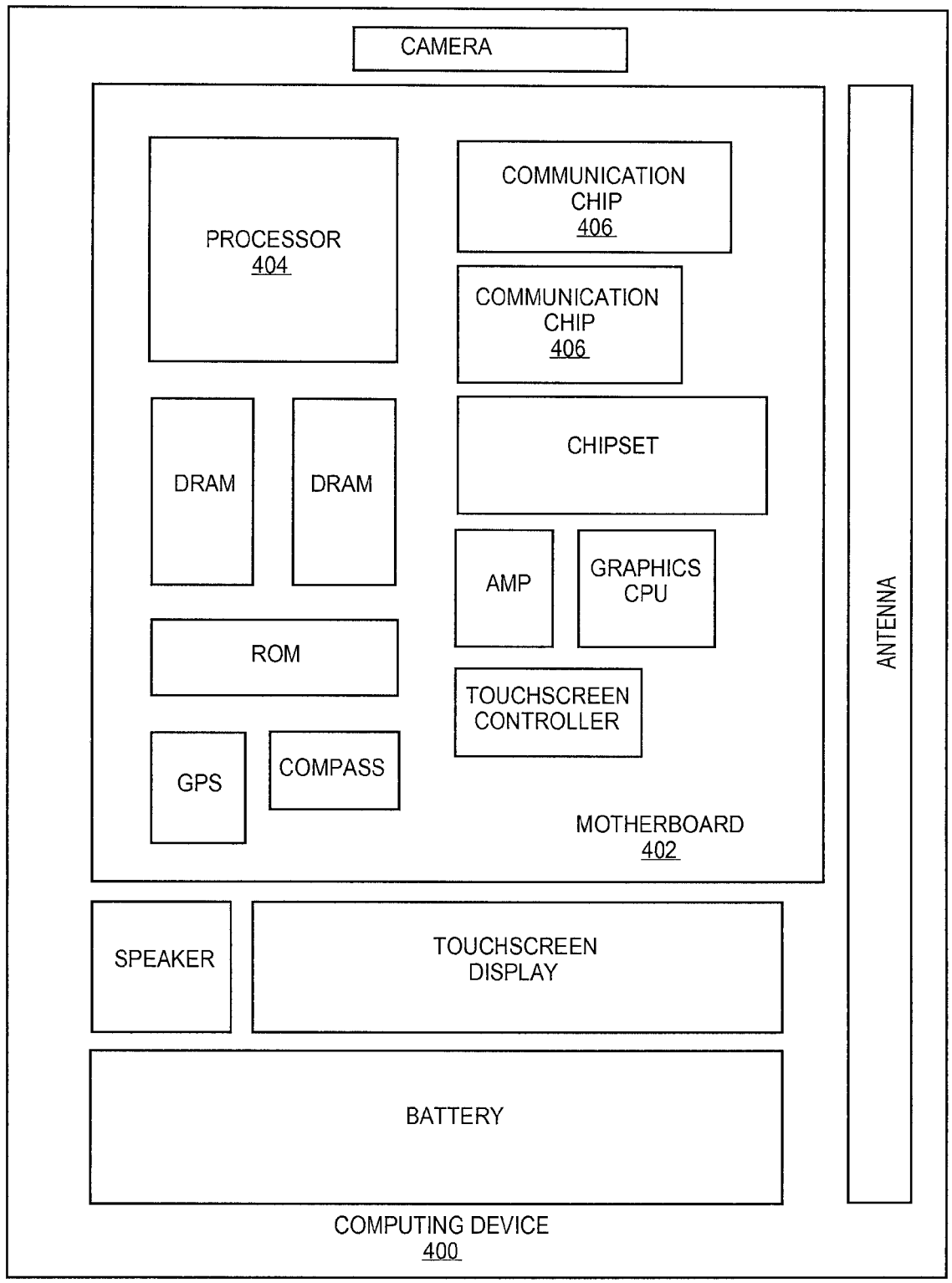
FIG. 4 illustrates a computing device in accordance with one embodiment of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more gate all-around transistors having a plurality of internal gate sidewall spacers, in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more gate all-around transistors having a plurality of internal gate sidewall spacers, in accordance with implementations of the invention.

In further implementations, another component housed within the computing device 400 may contain an integrated circuit die that includes one or more gate all-around transistors having a plurality of internal gate sidewall spacers, in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

In an embodiment, a semiconductor device comprises a nanowire stack disposed above a substrate, the nanowire stack having a plurality of vertically-stacked nanowires; a gate structure wrapped around each of the plurality of nanowires, defining a channel region of the device, the gate structure having gate sidewalls; a pair of source/drain regions on opposite sides of the channel region; and an internal spacer on a portion of the gate sidewall between two adjacent nanowires, internal to the nanowire stack. In an embodiment, the device further comprises internal spacers on each portion of the gate sidewalls underneath the bottom nanowire in the nanowire stack. In an embodiment, the internal spacers are formed from a low-k dielectric material selected from the group consisting of SiN, $SiO_2$, SiON, and SiC. In an embodiment, the device further comprises a pair of external spacers on a portion of the gate sidewall external to the nanowire stack. In an embodiment, the external spacers have a first thickness normal to the surface of the gate sidewall, wherein the internal spacers have a second thickness normal to the gate sidewall, and wherein the second thickness is equal to the first thickness. In an embodiment, the source/drain regions of the device comprise a source/drain portion of the nanowires. In another embodiment, the source/drain regions of the device comprise a homogeneous semiconductor material. In an embodiment, the gate structure comprises a gate dielectric and a gate electrode. In an embodiment, the substrate is an SOI substrate. In an embodiment, the device further comprises a pair of source/drain contacts in contact with the source/drain regions of the device. In an embodiment, the internal spacers isolate the source/drain contacts from the portion of the gate structure sidewall internal to the nanowire stack.

In an embodiment, a method comprises providing a substrate having: a nanowire stack disposed above a substrate, the nanowire stack having a plurality of vertically-stacked nanowires separated by sacrificial material; a gate structure defining a channel region of the device, wherein the gate structure has a pair of gate sidewalls; and a pair of source/drain regions on opposite sides of the channel region; etching to remove the gate structure, exposing the surfaces of the nanowire stack; etching to remove the sacrificial material from between the nanowires to expose the nanowire surfaces within the channel region; etching to remove a portion of sacrificial material between the nanowires in the source/drain region, creating a dimple in the source/drain region; and filling the dimples with spacer material to form a plurality of internal spacers. In an embodiment, the substrate is an SOI substrate having a base substrate, an insulation layer, and a single-crystal layer, wherein a bottom-most nanowire in the nanowire stack is formed from the single-crystal layer, and wherein the method further comprises etching to remove a portion of the insulation layer to form a dimple adjacent to the channel region. In an embodiment, the dimples are etched in alignment with the external spacers. In an embodiment, wherein filling the dimples with spacer material comprises conformally depositing spacer material on the exposed nanowire surfaces. In an embodiment, further comprising removing a portion of the spacer material to expose the nanowire surfaces within the channel region. In an embodiment, the method further comprises transforming the spacer material within the channel region, wherein transforming the spacer material comprises altering the etch selectivity of the spacer material. In an embodiment, the spacer material comprises one or more of plasma treatment, implantation, or oxidation. In an embodiment, the method further comprises depositing a gate dielectric and gate electrode within the channel region.

In another embodiment, a method comprises providing a substrate having: a nanowire stack disposed above a substrate, the nanowire stack having a plurality of vertically-stacked nanowires separated by sacrificial material; a gate structure defining a channel region of the device, wherein the gate structure has a pair of gate sidewalls; and a pair of source/drain regions on opposite sides of the channel region; etching to remove the sacrificial material from between the nanowires in the source/drain region, creating a plurality of dimples adjacent to the channel region; and filling the dimples with spacer material to form a plurality of internal spacers. In an embodiment, the substrate is an SOI substrate having a base substrate, an insulation layer, and a single-crystal layer, wherein a bottom-most nanowire in the nanowire stack is formed from the single-crystal layer, and wherein the method further comprises etching to remove a portion of the insulation layer to form a dimple adjacent to the channel region. In an embodiment, the dimples are etched in alignment with the external spacers. In an embodiment, filling the dimples with spacer material comprises depositing spacer material in the source/drain region. In an embodiment, the method further comprises removing a portion of the spacer material to expose the nanowire surfaces within the channel region. In an embodiment, the method further comprises transforming a portion of the spacer material within the source/drain region, but external to the dimple, wherein transforming the spacer material comprises altering the etch selectivity of the spacer material. In an embodiment, transforming the spacer material comprises one or more of plasma treatment, implantation, or oxidation.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the internal spacers and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

The invention claimed is:
1. An integrated circuit structure, comprising:
   a nanowire above a substrate;

a first gate structure adjacent to the nanowire, the first gate structure including having a first sidewall and a second sidewall opposite the first sidewall;

a first channel region adjacent to the first gate structure;

a first internal insulative spacer adjacent to a portion of the first sidewall of the first gate structure below the nanowire;

a second internal insulative spacer adjacent to a portion of the second sidewall of the first gate structure below the nanowire;

a second gate structure adjacent to the nanowire, the second gate structure including a first sidewall and a second sidewall opposite the first sidewall;

a second channel region adjacent to the second gate structure;

a third internal insulative spacer adjacent to a portion of the first sidewall of the second gate structure below the nanowire;

a fourth internal insulative spacer adjacent to a portion of the second sidewall of the second gate structure below the nanowire;

a first source or drain region on a first side of the first channel region;

a second source or drain region on a second side of the first channel region opposite the first side, and the second source or drain region on a first side of the second channel region; and a third source or drain region on a second side of the second channel region opposite the second side.

2. The integrated circuit structure of claim 1, further comprising:

a first external sidewall spacer adjacent to the first sidewall of the first gate structure above the nanowire;

a second external sidewall spacer adjacent to the second sidewall of the first gate structure above the nanowire;

a third external sidewall spacer adjacent to the first sidewall of the second gate structure above the nanowire;

a fourth external sidewall spacer adjacent to the second sidewall of the second gate structure above the nanowire.

3. The integrated circuit structure of claim 1, wherein the first gate structure comprises a first gate electrode and a first gate dielectric, and wherein the second gate structure comprises a second gate electrode and a second gate dielectric.

4. The integrated circuit structure of claim 3, wherein the first gate dielectric has a different composition than the first and second internal insulative spacers, and wherein the second gate dielectric has a different composition than the third and fourth internal insulative spacers.

5. The integrated circuit structure of claim 3, wherein the first gate dielectric is in direct contact with the first and second internal insulative spacers, and wherein the second gate dielectric is in direct contact with the third and fourth internal insulative spacers.

6. The integrated circuit structure of claim 1, wherein the first, second, third and fourth internal insulative spacers each comprise a dielectric material selected from the group consisting of SiN, SiO2, SiON, and SiC.

7. The integrated circuit structure of claim 1, wherein the substrate is an SOI substrate.

8. The integrated circuit structure of claim 1, further comprising first, second and third source or drain contacts in contact with the first, second and third source or drain regions, respectively.

9. The integrated circuit structure of claim 1, wherein the nanowire is a silicon nanowire.

\* \* \* \* \*